US012486595B2

(12) United States Patent
Wang et al.

(10) Patent No.: US 12,486,595 B2
(45) Date of Patent: *Dec. 2, 2025

(54) METHODS FOR CRYSTAL GROWTH BY REPLACING A SUBLIMATED TARGET SOURCE MATERIAL WITH A CANDIDATE SOURCE MATERIAL

(71) Applicant: MEISHAN BOYA ADVANCED MATERIALS CO., LTD., Sichuan (CN)

(72) Inventors: Yu Wang, Meishan (CN); Peng Gu, Meishan (CN); Zhenxing Liang, Meishan (CN); Min Li, Meishan (CN)

(73) Assignee: MEISHAN BOYA ADVANCED MATERIALS CO., LTD., Meishan (CN)

( * ) Notice: Subject to any disclaimer, the term of this patent is extended or adjusted under 35 U.S.C. 154(b) by 24 days.

This patent is subject to a terminal disclaimer.

(21) Appl. No.: 18/601,996

(22) Filed: Mar. 11, 2024

(65) Prior Publication Data

US 2024/0209543 A1 Jun. 27, 2024

Related U.S. Application Data

(63) Continuation of application No. 17/242,263, filed on Apr. 27, 2021, now Pat. No. 11,926,922, which is a (Continued)

(51) Int. Cl.

| | |
|---|---|
| ***C30B 23/00*** | (2006.01) |
| ***C30B 23/06*** | (2006.01) |

(Continued)

(52) U.S. Cl.

CPC .......... *C30B 23/005* (2013.01); *C30B 23/066* (2013.01); *C30B 29/16* (2013.01); (Continued)

(58) Field of Classification Search

CPC ..... C30B 23/00; C30B 23/002; C30B 23/005; C30B 23/02; C30B 23/06; C30B 23/066; (Continued)

(56) References Cited

U.S. PATENT DOCUMENTS 11,926,922 B2 * 3/2024 Wang .................... C30B 35/005
2002/0083891 A1 7/2002 Vodakov et al.
(Continued)

FOREIGN PATENT DOCUMENTS

CN 100558929 C 11/2009
CN 102021653 A 4/2011
(Continued)

OTHER PUBLICATIONS

International Search Report in PCT/CN2020/084583 mailed on Jan. 14, 2021, 8 pages.
(Continued)

*Primary Examiner* — Kenneth A Bratland, Jr.
(74) *Attorney, Agent, or Firm* — METIS IP LLC

(57) ABSTRACT

The embodiments of the present disclosure disclose a method and an apparatus for crystal growth. The method for crystal growth may include: placing a seed crystal and a target source material in a growth chamber of an apparatus for crystal growth; executing a growth of a crystal based on the seed crystal and the target source material according to physical vapor transport; determining whether a preset condition is satisfied during the crystal growth process; and in response to determining that the preset condition is satisfied, replacing a sublimated target source material with a candidate source material. In the present disclosure, by replacing the sublimated target source material with the candidate source material, a crystal with large-size and high-quality can be grown.

20 Claims, 2 Drawing Sheets

200

Related U.S. Application Data continuation of application No. PCT/CN2020/084583, filed on Apr. 14, 2020.

(51) Int. Cl.
*C30B 29/16* (2006.01)
*C30B 29/36* (2006.01)
*C30B 29/38* (2006.01)
*C30B 35/00* (2006.01)

(52) U.S. Cl.
CPC .............. *C30B 29/36* (2013.01); *C30B 29/38* (2013.01); *C30B 35/005* (2013.01)

(58) Field of Classification Search
CPC ......... C30B 29/00; C30B 29/10; C30B 29/16; C30B 29/36; C30B 29/38; C30B 35/00; C30B 35/005
USPC ........ 117/84–86, 88, 98, 102, 107, 200–202, 117/204, 937, 951
See application file for complete search history.

(56) References Cited

U.S. PATENT DOCUMENTS

| | | | |
|---|---|---|---|
| 2006/0254505 | A1 | 11/2006 | Tsvetkov et al. |
| 2011/0030611 | A1 | 2/2011 | Santailler et al. |
| 2012/0086001 | A1 | 4/2012 | Wang |
| 2018/0277635 | A1 | 9/2018 | Wada et al. |

FOREIGN PATENT DOCUMENTS

| | | | | |
|---|---|---|---|---|
| CN | 102618930 | A | | 8/2012 |
| CN | 102899718 | A | | 1/2013 |
| CN | 102021653 | B | | 6/2013 |
| CN | 103571488 | A | | 2/2014 |
| CN | 204417652 | U | | 6/2015 |
| CN | 205474112 | U | | 8/2016 |
| CN | 106191998 | A | | 12/2016 |
| CN | 106801258 | A | | 6/2017 |
| CN | 107904657 | A | | 4/2018 |
| CN | 107955969 | A | * | 4/2018 |
| CN | 108374197 | A | | 8/2018 |
| CN | 109576783 | A | | 4/2019 |
| CN | 110983443 | A | | 4/2020 |
| JP | H05306199 | A | | 11/1993 |
| JP | 06001699 | A | * | 1/1994 |
| JP | H061699 | A | | 1/1994 |
| JP | 2015040146 | A | | 3/2015 |
| JP | 2016204197 | A | | 12/2016 |

OTHER PUBLICATIONS

Written Opinion in PCT/CN2020/084583 mailed on Jan. 14, 2021, 10 pages.
First Office Action in Chinese Application No. 202080004445.0 mailed on May 18, 2021, 21 pages.
The Extended European Search Report in European Application No. 20878022.1 mailed on Dec. 7, 2021, 10 pages.
Notice of Reasons for Rejection in Japanese Application No. 2022562114 mailed on Oct. 31, 2023, 5 pages.
Decision to Grant a Patent in Japanese Application No. 2022-562114 mailed on Jun. 10, 2025, 6 pages.

* cited by examiner

METHODS FOR CRYSTAL GROWTH BY REPLACING A SUBLIMATED TARGET SOURCE MATERIAL WITH A CANDIDATE SOURCE MATERIAL

CROSS-REFERENCE TO RELATED APPLICATIONS

This application is a Continuation of U.S. patent application Ser. No. 17/242,263, filed on Apr. 27, 2021, which is a Continuation of International Application No. PCT/CN2020/084583, filed on Apr. 14, 2020, the entire contents of each of which are hereby incorporated by reference.

TECHNICAL FIELD

The present disclosure generally relates to the field of crystal growth, and in particular, to methods and apparatuses for crystal growth for growing large-size and high-quality crystals.

BACKGROUND

Physical vapor transport (PVT) is a common method for crystal growth, during which materials can be sublimated in high-temperature regions and crystals can be grown in low-temperature regions using diffusion and transport of vapor. For the PVT, raw materials can spontaneously nucleate and corresponding crystals can be grown; alternatively, the raw materials may be sublimated to be deposited on existing seed crystals and then corresponding crystals can be grown. However, in the traditional PVT, there are certain limits to the crystal size and quality. Therefore, it is desirable to provide methods and apparatuses for crystal growth for growing crystals with large-size and high-quality.

SUMMARY

One embodiment of the present disclosure provides a method for crystal growth. The method for crystal growth may include placing a seed crystal and a target source material in a growth chamber of an apparatus for crystal growth; executing a growth of a crystal based on the seed crystal and the target source material according to physical vapor transmission; determining whether a preset condition is satisfied during the crystal growth process; and in response to determining that the preset condition is satisfied, replacing a sublimated target source material with a candidate source material.

In some embodiments, the target source material or the candidate source material may include a block material.

In some embodiments, a shape of the block material may include a cube, a cuboid, or an irregular block.

In some embodiments, a thickness of the block material may be less than a preset thickness threshold.

In some embodiments, a thickness of the block material may be 30 millimeters 40 millimeters.

In some embodiments, the target source material and/or the candidate source material may be prepared through a processing process. The processing process may include preparing the target source material and/or the candidate source material by performing at least one of a pressing operation, a sintering operation, a polishing operation, or a purging operation on powder source materials.

In some embodiments, a processing condition of the sintering operation may include an inert atmosphere condition.

In some embodiments, the replacing the sublimated target source material with the candidate source material may include placing the candidate source material in a first region of the apparatus for crystal growth; and controlling, by a control component, the candidate source material to push the sublimated target source material such that the candidate source material may leave the first region and enter the growth chamber; and the sublimated target source material may leave the growth chamber and enter a second region of the apparatus for crystal growth.

In some embodiments, a temperature of the first region may be lower than a temperature of the growth chamber. A temperature difference between the first region and the growth chamber may be less than a first preset temperature threshold.

In some embodiments, the method may further include performing a preheating treatment on the candidate source material in the first region. The preheating treatment may include heating the candidate source material to a sublimation temperature of the crystal and keeping the sublimation temperature for a preset time period.

In some embodiments, a speed that the control component controls the candidate source material to push the sublimated target source material may be less than a preset speed threshold.

In some embodiments, a speed that the control component controls the candidate source material to push the sublimated target source material may be 100 millimeters/hour~150 millimeters/hour.

In some embodiments, a temperature of the second region may be lower than a temperature of the growth chamber. A temperature difference between the second region and the growth chamber may be less than a second preset temperature threshold.

In some embodiments, the crystal may include silicon carbide, aluminum nitride, zinc oxide, or zinc telluride.

One embodiment of the present disclosure provides an apparatus for crystal growth. The apparatus for crystal growth may include a growth chamber and a control component. The growth chamber may be configured to place a seed crystal and a target source material and execute a growth of a crystal based on the seed crystal and the target source material according to physical vapor transport. The control component may be configured to: in response to determining that a preset condition is satisfied during the crystal growth process, replace a sublimated target source material with a candidate source material.

In some embodiments, the replacing the sublimated target source material with the candidate source material, the control component may be configured to control the candidate source material to push the sublimated target source material such that the candidate source material leaves a first region of the apparatus and enters the growth chamber; and the sublimated target source material leaves the growth chamber and enters a second region of the apparatus.

In some embodiments, the first region may be configured to place the candidate source material; and/or perform a preheating treatment on the candidate source material.

In some embodiments, a temperature of the first region may be lower than a temperature of the growth chamber. A temperature difference between the first region and the growth chamber may be less than a first preset temperature threshold.

In some embodiments, a speed that the control component controls the candidate source material to push the sublimated target source material may be less than a preset speed threshold.

In some embodiments, a speed that the control component controls the candidate source material to push the sublimated target source material may be 100 millimeters/hour~150 millimeters/hour.

In some embodiments, a temperature of the second region may be lower than a temperature of the growth chamber. A temperature difference between the second region and the growth chamber may be less than a second preset temperature threshold.

BRIEF DESCRIPTION OF THE DRAWINGS

The present disclosure is further illustrated in terms of exemplary embodiments. These exemplary embodiments are described in detail with reference to the drawings. These embodiments are non-limiting exemplary embodiments, in which like reference numerals represent similar structures, and wherein.

DETAILED DESCRIPTION

Figure 1:
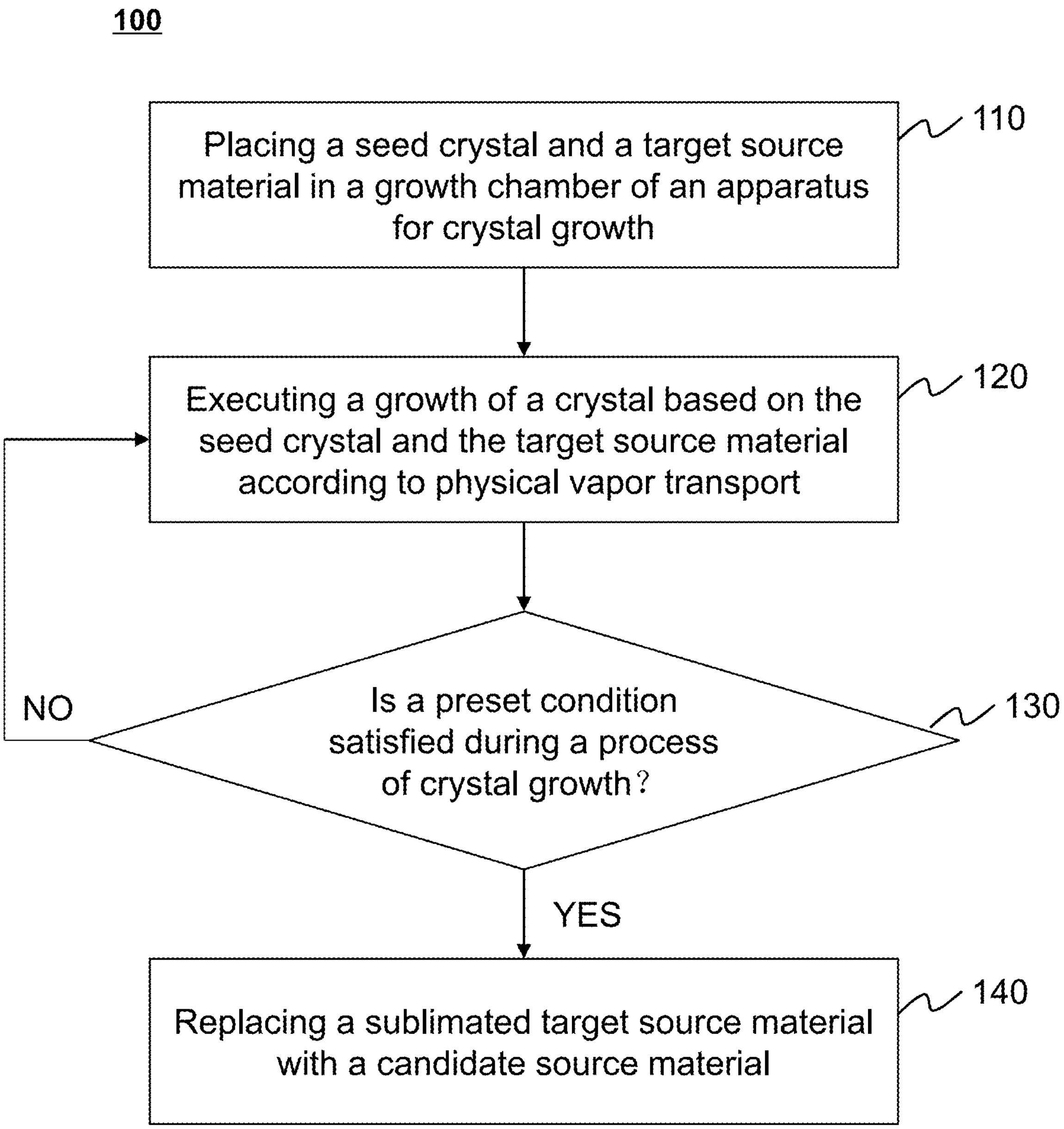
FIG. 1 is a flowchart illustrating an exemplary process for crystal growth according to some embodiments of the present disclosure.

In order to illustrate the technical solutions related to the embodiments of the present disclosure, a brief introduction of the drawings referred to the description of the embodiments is provided below. Obviously, drawings described below are only some examples or embodiments of the present disclosure. Those having ordinary skills in the art, without further creative efforts, may apply the present disclosure to other similar scenarios according to these drawings. Unless apparent from the locale or otherwise stated, like reference numerals represent similar structures or operations in the drawings.

It will be understood that the terms "system," "device," "unit," and/or "module" used herein are one method to distinguish different components, elements, parts, sections, or assemblies of different levels. However, if other words may achieve the same purpose, the words may be replaced by other expressions.

As used in the disclosure and the appended claims, the singular forms "a," "an," and "the" include plural referents unless the content clearly dictates otherwise. In general, the terms "comprise," "comprises," and/or "comprising," "include," "includes," and/or "including," merely prompt to include steps and elements that have been clearly identified, and these steps and elements do not constitute an exclusive listing. The methods or devices may also include other steps or elements.

A numerical range used herein is used for a concise description of each value included in the range.

A flowchart is used in the present disclosure to illustrate operations performed by the system according to the embodiment of the present disclosure. It should be understood that the preceding or following operations are not necessarily performed exactly in order. Instead, the steps (or operations) may be processed in reverse order or simultaneously. At the same time, other operations may be added to these processes. Alternatively, an operation or several operations may be removed from these processes.

Physical vapor transport (PVT) can be applied in crystal growth of various kinds of crystals. For traditional PVT, powders are generally used as source materials. Taking growing silicon carbide single crystal as an example, silicon carbide powders are usually used as source materials. With a sublimation of the silicon carbide powders, gaseous components (e.g., Si, $SiC_2$, $Si_2C$) generated by a decomposition of the silicon carbide powders are driven by an axial temperature gradient to diffuse to a seed crystal of silicon carbide. Then the gaseous components grow at the seed crystal of silicon carbide to form the silicon carbide single crystal. However, a solid component carbon (C) generated by the decomposition of sublimated silicon carbide powders are deposited on un-sublimated silicon carbide powders. The deposition may cause the silicon carbide powders gradually being enriched with carbon, resulting in a decrease of the sublimation rate (or speed) of the silicon carbide powders. Accordingly, the silicon carbide single crystal may no longer continue to be rapidly grown. Finally, a growth length of the silicon carbide single crystal may be limited (e.g., limited to 30 millimeters~50 millimeters). If the above un-sublimated silicon carbide powders enriched with carbon are replaced by silicon carbide powders continuously, since the silicon carbide powders are light in weight, the silicon carbide powders may adhere to the seed crystal of silicon carbide or the silicon carbide single crystal being grown during the replacement process, then a cladding body may be formed, resulting in defects in the grown silicon carbide single crystal, which may seriously affect the crystal quality of the single crystal. Therefore, one aspect of the present disclosure provides a method and an apparatus for crystal growth, which may use a block material as the source material and dynamically monitor the crystal growth process. According to specific conditions, the sublimated source material may be continuously replaced with a candidate source material to ensure that the crystal can continue to be grown rapidly, thereby preparing crystals with large-size and high-quality. The embodiments of the present disclosure may be applied in crystal growth of various kinds of crystals, for example, silicon carbide, aluminum nitride, zinc oxide, zinc telluride, etc.

FIG. 1 is a flowchart illustrating an exemplary process for crystal growth according to some embodiments of the present disclosure. In some embodiments, the process 100 may be automatically performed by a control system. For example, the process 100 may be implemented through control instructions. The control system may control, based on the control instructions, one or more components to complete operations of the process 100. In some embodiments, the process 100 may be performed semi-automatically. For example, one or more operations of the process 100 may be performed manually by an operator. In some embodiments, one or more additional operations may be added in the process 100, and/or one or more operations in the process 100 may be deleted. In addition, the order of operations shown in FIG. 1 is not limiting.

In 110, a seed crystal and a target source material may be placed in a growth chamber of an apparatus for crystal growth.

The seed crystal may be a small crystal having a same crystal orientation as a crystal to be grown. The seed crystal may be used as a seed for growing the crystal. In some embodiments, the seed crystal may be prepared based on physical vapor transport (PVT), chemical vapor deposition (CVD), a Czochralski technique, etc.

The target source material may include a material for supplying the seed crystal to grow into the crystal. For example, a component of the target source material of a silicon carbide crystal may include silicon carbide (SiC). As another example, a component of the target source material of an aluminum nitride crystal may include aluminium nitride (AlN). In some embodiments, the target source material may be a block material. A shape of the block material may include a cube, a cuboid, an irregular block, etc.

In some embodiments, in order to grow the crystal with high-quality and improve a utilization rate of the target source material, a thickness of the block material may be less than a preset thickness threshold. The preset thickness threshold may be a default setting of the system. Alternatively, the preset thickness threshold may be adjusted according to different situations. In some embodiments, the preset thickness threshold may be determined according to a type of the crystal to be grown, a size (e.g., a size of the growth chamber) of the apparatus for crystal growth, etc. For example, the preset thickness threshold may be 41 millimeters, 43 millimeters, 45 millimeters, 47 millimeters, 49 millimeters, 51 millimeters, 53 millimeters, 55 millimeters, etc.

In some embodiments, the thickness of the block material may be 30 millimeters~40 millimeters. In some embodiments, the thickness of the block material may be 31 millimeters~39 millimeters. In some embodiments, the thickness of the block material may be 32 millimeters~38 millimeters. In some embodiments, the thickness of the block material may be 33 millimeters~37 millimeters. In some embodiments, the thickness of the block material may be 34 millimeters~36 millimeters. In some embodiments, the thickness of the block material may be 35 millimeters. For example, for the growth of the silicon carbide crystal, the target source material may be a silicon carbide block with a thickness of 30 millimeters~40 millimeters.

In some embodiments, the target source material may be prepared through a processing process. The processing process may include performing an operation on powder source materials. The operation may include one or more of a pressing operation, a sintering operation, a polishing operation, a purging operation, etc. The pressing operation may include placing the powder source materials in a mold or other container and pressing the powder source materials into a preset shape and/or size (a product of the pressing operation can be called as a "pressed intermediate") under an external force (e.g., a preset pressure). The sintering operation may include making the powder source material or the pressed intermediate to reach a preset strength and densified (a product of the sintering operation can be called as a "sintered intermediate") under a preset condition (e.g., a preset sintering temperature, a preset sintering time length, a sintering atmosphere). In some embodiments, in order to avoid oxidation of the powder source materials, the sintering operation may be performed in an inert (e.g., nitrogen, helium) atmosphere. The polishing operation may include reducing a surface roughness of an object to be polished (e.g., the pressed intermediate, the sintered intermediate) to make a surface of the object smooth (a product of the polishing operation may be called as a "polished intermediate"). The purging operation may include cleaning a surface of an object to be purged (e.g., the pressed intermediate, the sintered intermediate, the polished intermediate) in a preset condition (e.g., a preset purging pressure). In some embodiments, the purging operation may be performed in an inert (e.g., nitrogen, helium) atmosphere. In some embodiments, the processing process may also include operations such as uniformly mixing a variety of powder source materials.

In some embodiments, a purity of the powder source material may be greater than or equal to 99.999%. In some embodiments, a particle size of the powder source material may be 20 micrometers~50 micrometers. In some embodiments, the particle size of the powder source material may be 22 micrometers~48 micrometers. In some embodiments, the particle size of the powder source material may be 24 micrometers 46 micrometers. In some embodiments, the particle size of the powder source material may be 26 micrometers~44 micrometers. In some embodiments, the particle size of the powder source material may be 28 micrometers~42 micrometers. In some embodiments, the particle size of the powder source material may be 30 micrometers 40 micrometers. In some embodiments, the particle size of the powder source material may be 32 micrometers~38 micrometers. In some embodiments, the particle size of the powder source material may be 34 micrometers~36 micrometers. In some embodiments, the particle size of the powder source material may be 35 micrometers.

In some embodiments, a component of the powder source material and a component of the target source material may be the same as a component of the crystal to be grown. For example, for the growth of an aluminum nitride crystal, both the component of the powder source material and the component of the target source material may include AlN. For instance, the powder source material may be aluminum nitride powders with a purity greater than 99.999% and a particle size of 20 micrometers 50 micrometers. The target source material may be a block of aluminum nitride prepared by pressing, sintering, polishing, and blowing the aluminum nitride powders.

In some embodiments, the component of the powder source material and the component of the target source material may be different from the component of the crystal to be grown. For example, for the growth of a 6H—SiC crystal, both the component of the powder source material and the component of the target source material may include SiC and Si. For instance, the powder source material may include silicon carbide powders with a purity greater than 99.999% and a particle size of 20 micrometers~50 micrometers and silicon powders with a purity greater than 99.999% and a particle size of 20 micrometers~40 micrometers in a preset ratio. The target source material may be a block prepared by mixing, pressing, sintering, polishing, and blowing the silicon carbide powders and the silicon powders. The silicon powders can not only improve an adhesion of the powder source materials and make the powder source materials easy to be pressed and sintered into the target source material, but also can make the growth chamber of the apparatus for crystal growth rich in silicon, which is conducive to the growth of the 6H—SiC crystal. However, since a melting point of silicon is relatively low, if a content of the silicon powders is too high, the silicon powders may contaminate the growth chamber. Therefore, the content of the silicon powders should be appropriate. In some embodiments, the preset ratio may include a mass ratio of the silicon powders to the silicon carbide powders. For example, the preset ratio may be 5%~10%. As another example, the preset ratio may be 6%~9%. As still another example, the preset ratio may be 6.5%~8.5%. As further another example, the preset ratio may be is 7%~8%. For instance, the preset ratio may be 7.5%.

In some embodiments, an inside of the growth chamber (e.g., a crucible) may have a preset temperature gradient (e.g., a preset axial temperature gradient) to promote the crystal growth. The preset temperature gradient may be determined according to the type of the crystal to be grown, etc. In some embodiments, the seed crystal may be placed in a relatively low-temperature region and the target source material may be placed in a relatively high-temperature region. In some embodiments, the seed crystal may be placed coaxially with the target source material with a preset axial distance. In some embodiments, the seed crystal may be placed in a top region of the growth chamber. For example, the seed crystal may be fixed on a top cover inside the growth chamber via an adhesive (e.g., sucrose). For instance, the sucrose may be flatted on the top cover inside the growth chamber, and then heated and kept for a preset time period. Subsequently, the seed crystal may be placed on the top cover flatted with the sucrose to be concentric with the top cover. Alternatively, the seed crystal may be pressed and heated together with the top cover flatted with the sucrose and kept for a preset time period. After the seed crystal is slowly cooled, the seed crystal may be fixed on the top cover inside the growth chamber. In some embodiments, the target source material may be placed flat on a bottom region of the growth chamber and heated by a heating element. More descriptions regarding a placement region of the seed crystal and the target source material in the growth chamber may be found elsewhere in the present disclosure, for example, FIG. 2 and the description thereof.

In 120, a growth of the crystal may be executed based on the seed crystal and the target source material according to physical vapor transport (PVT).

As described in operation 110, the target source material may be placed in the relatively high-temperature region and the seed crystal may be placed in the relatively low-temperature region. During the crystal growth process according to PVT, the target source material may be sublimated and decomposed into vapor components. Taking growing silicon carbide crystal as an example, the vapor components may include Si, $SiC_2$, $Si_2C$, etc. The vapor components may be driven by the axial temperature gradient in the growth chamber to diffuse to the seed crystal and gradually grow along with the seed crystal.

In 130, whether a preset condition is satisfied may be determined during the process of crystal growth.

In some embodiments, the preset condition may include that a crystal growth time length reaches a preset time length, a crystal growth rate reaches a first preset growth rate, a sublimation rate of the target source material reaches a preset sublimation rate, or the like, or any combination thereof. In some embodiments, the preset time length, the first preset growth rate, and/or the preset sublimation rate may be default settings of the system. Alternatively, the preset time length, the first preset growth rate, and/or the preset sublimation rate may be adjusted according to different situations. For example, the preset time length, the first preset growth rate, and/or the preset sublimation rate may be determined according to the type of the crystal to be grown, the component of the target source material, the size of the target source material, or the like, or any combination thereof. For instance, in order to ensure that the target source material is fully utilized and the crystal quality is relatively high, the preset time length should be within a preset time interval. Merely by way of example, for the growth of the 6H—SiC crystal, the mass ratio of the silicon powders to the silicon carbide powders in the target source material may be 8% and the thickness of the target source material may be 36 millimeters. In such cases, the preset time length may be 20 hours~25 hours.

In some embodiments, the growth rate of the crystal may be determined according to Equation (1):

$$v = \frac{\Delta m}{S \cdot \rho \cdot t}, \tag{1}$$

where v represents the growth rate of the crystal, Δm represents an increased weight of the crystal grown in a specific time period, ρ represents a density of the crystal, t represents a time period, and S represents an inner area of the top cover inside the growth chamber. In some embodiments, the increased weight of the crystal grown in the specific time period may be measured by a weight sensor. The density of the crystal may be a physical characteristic of the crystal. For example, a density of the silicon carbide crystal is 3.21 $g/cm^3$. In the crystal growth process, an increased weight of the crystal may be mainly reflected in a length of the crystal (since an increase in a diameter of the crystal may be very small, the increase in the diameter of the crystal may be ignored).

In response to determining that the preset condition is satisfied, the process 100 may proceed to operation 140 to replace the sublimated target source material with a candidate source material. In response to determining that the preset condition is not satisfied, the process 100 may proceed back to operation 120, that is, the crystal growth may be continued based on the seed crystal and the target source material according to PVT.

In 140, the sublimated target source material may be replaced with the candidate source material.

The sublimated target source material may refer to the target source material after sublimation and decomposition. In some embodiments, the sublimated target source material may have the same component as the target source material. For example, for the growth of the aluminum nitride (AlN) crystal, the component of the target source material may include AlN. Since the target source material of aluminum nitride sublimates and decomposes to produce only vapor components of AlN, Al, and nitrogen ($N_2$), the component of the sublimated target source material after sublimation also includes AlN. In some embodiments, the component of the sublimated target source material may be different from the component of the target source material. For example, for the growth of the 6H—SiC crystal, the component of the target source material may include SiC and Si. Since the target source material of silicon nitride sublimates and decomposes to produce vapor components (e.g., Si, $SiC_2$, $Si_2C$) and solid component C, the solid component C may adhere to the sublimated target source material, and the components of the sublimated target source material may include SiC, C, and/or Si.

In some embodiments, as described in operation 110, the candidate source material may also be prepared through a processing process. The processing process may include performing an operation on powder source materials. The operation may include one or more of a pressing operation, a sintering operation, a polishing operation, or a purging operation. In some embodiments, the processing process of the candidate source material may be the same as or different from that of the target source material. In some embodiments, the candidate source material and the target source material may be the same or different. For example, the component(s) of the candidate source material may be the same as the component(s) of the target source material, and a size of the candidate source material may be the same as the size of the target source material. As another example, the component(s) of the candidate source material may be the same as the component(s) of the target source material, but the size of the candidate source material may be different from the size of the target source material. As further another example, the component(s) of the candidate source material may be different from the component(s) of the target source material, but the size of the candidate source material may be the same as the size of the target source material. As still another example, the component(s) of the candidate source material may be different from the component(s) of the target source material, and the size of the candidate source material may be different from the size of the target source material.

In some embodiments, the candidate source material may be placed in a first region of the apparatus for crystal growth. The first region may be adjacent to (e.g., on one side of the growth chamber) the growth chamber. In some embodiments, the candidate source material may be controlled by the control component to push the sublimated target source material, such that the candidate source material may leave the first region and enter the growth chamber and the sublimated target source material may leave the growth chamber and enter a second region of the apparatus for crystal growth. The second region may be adjacent to (e.g., on the other side of the growth chamber) the growth chamber. The candidate source material is controlled to move to gradually approach the sublimated target source material until the candidate source material is in contact with the sublimated target source material, causing the candidate source material to push the sublimated target source material to leave the growth chamber.

In some embodiments, the first region may be configured to perform a preheating treatment on the candidate source material. The preheating treatment may include heating the candidate source material to a sublimation temperature of the candidate source material and keeping the sublimation temperature for a preset time period, such that a sublimation rate of the candidate source material when entering the growth chamber may be the same as or substantially the same as a sublimation rate of the target source material (i.e., the sublimated target source material) in the growth chamber, thereby ensuring the growth of the crystal. The preset time period may be a default setting of the system. Alternatively, the preset time period may be adjusted according to different situations. For example, the preset time period may be determined according to the type and/or size of the candidate source material. In some embodiments, a temperature of the first region may be lower than a temperature of the growth chamber, and a temperature difference between the first region and the growth chamber may be less than a first preset temperature threshold. The first preset temperature threshold may be a default setting of the system. Alternatively, the first preset temperature threshold may be adjusted according to different situations. For example, the first preset temperature threshold may be determined according to a distance between the first region and the growth chamber, the type of the crystal, etc.

In some embodiments, the second region may be used to temporarily store the sublimated target source material that has been replaced. In some embodiments, in order to maintain a stable temperature of the growth chamber to ensure the crystal growth and the crystal quality, a temperature of the second region may be lower than the temperature of the growth chamber, and a temperature difference between the second region and the growth chamber may be less than a second preset temperature threshold. Similarly, the second preset temperature threshold may be a default setting of the system. Alternatively, the second preset temperature threshold may be adjusted according to different situations. For example, the second preset temperature threshold may be determined according to a distance between the second region and the growth chamber, the type of the crystal, etc.

In some embodiments, a speed that the control component controls the candidate source material to push the sublimated target source material may be less than a preset speed threshold. In some embodiments, the preset speed threshold may be a default setting of the system. Alternatively, the preset speed threshold may be adjusted according to different situations. For example, the preset speed threshold may be determined according to a weight of the target source material, a weight of the sublimated target source material, a weight of the candidate source material, the type of the crystal, etc. For instance, the preset speed threshold may be 160 millimeters/hour, 180 millimeters/hour, 200 millimeters/hour, 220 millimeters/hour, 240 millimeters/hour, etc.

In some embodiments, the speed that the control component controls the candidate source material to push the sublimated target source material may be 100 millimeters/hour~150 millimeters/hour. In some embodiments, the speed that the control component controls the candidate source material to push the sublimated target source material may be 105 millimeters/hour~145 millimeters/hour. In some embodiments, the speed that the control component controls the candidate source material to push the sublimated target source material may be 110 millimeters/hour 140 millimeters/hour. In some embodiments, the speed that the control component controls the candidate source material to push the sublimated target source material may be 115 millimeters/hour~135 millimeters/hour. In some embodiments, the speed that the control component controls the candidate source material to push the sublimated target source material may be 120 millimeters/hour~130 millimeters/hour. In some embodiments, the speed that the control component controls the candidate source material to push the sublimated target source material may be 122 millimeters/hour~128 millimeters/hour. In some embodiments, the speed that the control component controls the candidate source material to push the sublimated target source material may be 124 millimeters/hour~126 millimeters/hour. The above speeds are merely for reference, and the speed and the preset speed threshold may not be limiting in the present disclosure, it is only necessary to ensure that the crystal growth process is not disturbed or affected during the process that the candidate source material enters the growth chamber and the sublimated target source material leaves the growth chamber.

In some embodiments, as described in operation 130, the increase in the weight of the crystal may be mainly reflected in the length of the crystal. As the crystal grows, a distance between a portion where the length of the crystal increases (i.e., a portion where the crystal is growing) and the target source material and/or the candidate source material may be shortened, which results in that growth temperatures of the crystal in a length direction may be different. Accordingly, a performance (e.g., uniformity) of the crystal may be affected, thereby affecting the crystal quality. In order to grow a large-size and uniform crystal, whether the preset condition is satisfied may be determined during the crystal growth process. In some embodiments, the preset condition may include that the distance between the portion where the length of the crystal increases and the target source material and/or the candidate source material reaches a preset distance, the growth rate of the crystal reaches a second preset growth rate, etc. In some embodiments, the preset distance and the second preset growth rate may be default settings of the system. Alternatively, the preset distance and the second preset growth rate may be adjusted according to different situations. For example, the preset distance and the second preset growth rate may be determined according to the type of the crystal, the inner area of the top cover inside the growth chamber, etc. For instance, in order to grow the large-size and uniform crystal, the second preset growth rate should be within a preset growth rate interval. Merely by way of example, for the growth of the 6H—SiC crystal, the second preset growth rate may be 0.7 millimeters/hour~0.8 millimeters/hour. In some embodiments, the second preset growth rate may be 0.78 millimeters/hour. In some embodiments, the second preset growth rate may be 0.76 millimeters/hour. In some embodiments, the second preset growth rate may be 0.74 millimeters/hour. In some embodiments, the second preset growth rate may be 0.72 millimeters/hour. In some embodiments, the second preset growth rate may be 0.7 millimeters/hour.

In response to determining that the preset condition is satisfied, the crystal being grown may be pulled at a specific rate. In some embodiments, in order to grow the large-size and uniform crystal, the specific rate may be equal to the growth rate of the crystal, and a pulling direction may be an opposite direction of the crystal growth in an axial direction. In response to determining that the preset condition is not satisfied, the crystal growth may be continued based on the seed crystal and the target source material according to PVT.

It should be noted that the above description of the process 100 is merely provided for example and illustration, and not intended to limit the scope of the present disclosure. For persons having ordinary skills in the art, multiple variations and modifications on the process 100 may be made under the teachings of the present disclosure. However, those variations and modifications do not depart from the scope of the present disclosure.

Figure 2:
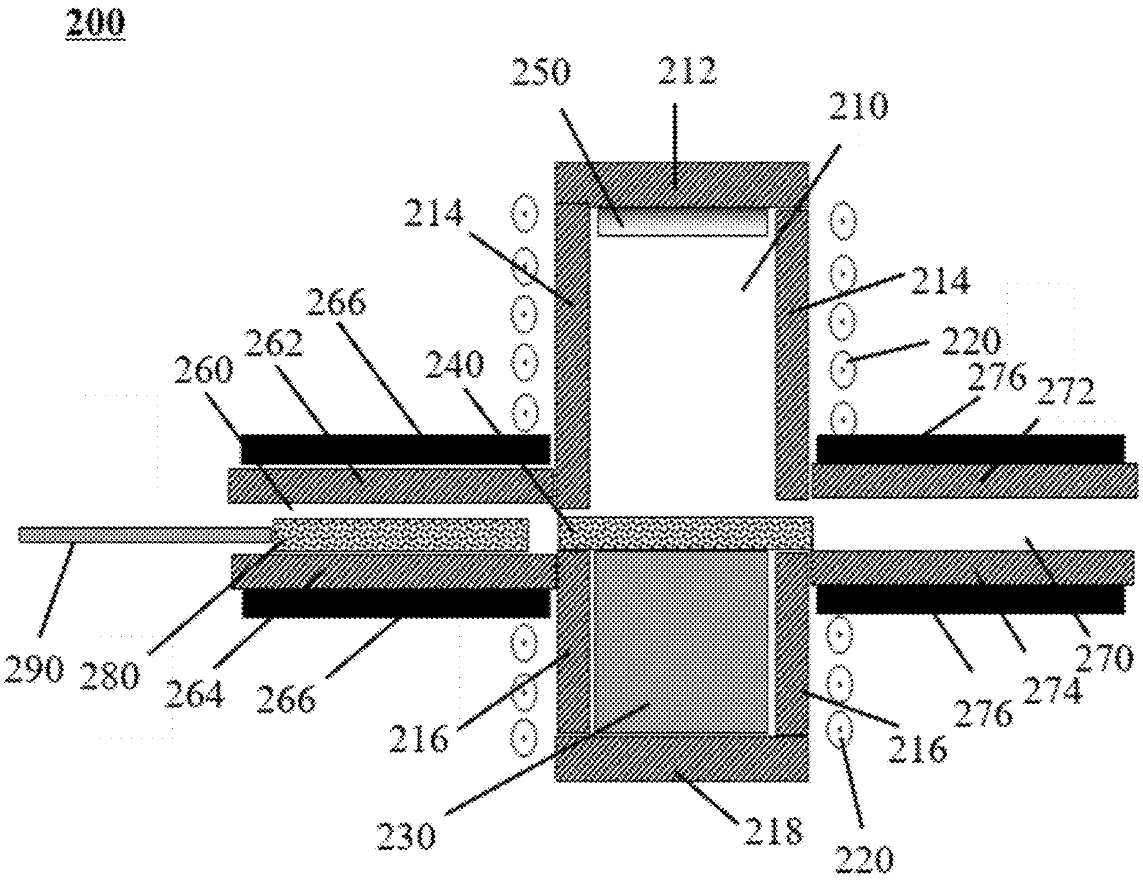
FIG. 2 is a schematic diagram illustrating a cross-sectional structure of an exemplary apparatus for crystal growth according to some embodiments of the present disclosure.

FIG. 2 is a schematic diagram illustrating a cross-sectional structure of an exemplary apparatus for crystal growth according to some embodiments of the present disclosure.

As shown in FIG. 2, the apparatus 200 for crystal growth may include a growth chamber 210 and a control component (not shown).

The growth chamber 210 may be configured to place a seed crystal 250 and a target source material 240, and execute a crystal growth based on the seed crystal 250 and the target source material 240 according to physical vapor transport (PVT). In some embodiments, a shape of the growth chamber 210 may include a cylinder, a cuboid, a cube, an arc-shape, etc. In some embodiments, the growth chamber 210 may include a top cover 212, side walls (e.g., a first side wall 214, a second side wall 216), and a bottom cover 218. In some embodiments, the top cover 212, the side walls, and the bottom cover 218 may be made of graphite with a purity greater than 99.99% (e.g., prepared by sintering). In some embodiments, the surface of the graphite may be coated with an oxidation-resistant and high-temperature resistant material (e.g., tantalum carbide). In some embodiments, the side wall(s) may be surrounded with a heating element 220. The heating element 220 may be used to heat the growth chamber 210 such that the growth chamber 210 may have and maintain an axial temperature gradient that the crystal growth needs. In some embodiments, the heating element 220 may include an induction coil.

In some embodiments, the seed crystal 250 may be adhesively fixed inside the top cover 212. In some embodiments, the growth chamber 210 may include a first portion (i.e., an upper portion) surrounded by the top cover 212 and the first side wall 214 and a second portion (i.e., a lower portion) surrounded by the bottom cover 218 and the second side wall 216. In some embodiments, the top cover 212 and the first side wall 214 may be detachable, such that the top cover 212 can be detached and the seed crystal 250 can be placed thereon, and the top cover 212 and the crystal being grown can be pulled as a whole to grow a large-size and uniform crystal. The bottom cover 218 and the second side wall 216 may be separable or integrally formed. In some embodiments, a thermally conductive element 230 may be placed in the second portion. The target source material 240 may be placed on the thermally conductive element 230. The thermally conductive element 230 may transfer heat generated by the heating element 220 to the target source material 240. In some embodiments, the thermally conductive element 230 may be made of graphite with a purity greater than 99.99% (e.g., prepared by sintering). In some embodiments, the surface of the graphite may be coated with an oxidation-resistant and high-temperature resistant material (e.g., tantalum carbide).

In some embodiments, the first side wall 214 and the second side wall 216 may be separated by a preset distance, such that a candidate source material 280 may enter the growth chamber 210 and the sublimated target source material 240 (for brevity, the target source material and the sublimated target source material are uniformly denoted as 240) may leave the growth chamber 210. In some embodiments, the preset distance may be a default setting of the system. Alternatively, the preset distance may be adjusted according to different situations. In some embodiments, in order to ensure that the candidate source material 280 can smoothly enter the growth chamber 210 and the sublimated target source material 240 can smoothly leave the growth chamber 210, the preset distance should be greater than a thickness of the candidate source material 280 and a thickness of the sublimated target source material 240. In some embodiments, in order to ensure that a temperature in the growth chamber 210 is uniform, the preset distance should be greater than the thickness of the candidate source material 280 and the thickness of the sublimated target source material 240, and also be less than a preset value.

In some embodiments, the control component may be configured to control the candidate source material 280 to push the sublimated target source material 240, such that the candidate source material 280 may be caused to leave the first region 260 and enter the growth chamber 210, and the sublimated target source material 240 may be caused to leave the growth chamber 210 and enter the second region 270.

In some embodiments, the first region 260 may be configured to place the candidate source material 280 and/or perform a preheating treatment on the candidate source material 280. In some embodiments, the preheating treatment may include heating the candidate source material 280 to a sublimation temperature of the candidate source material 280 and keeping the sublimation temperature for a preset time period, such that a sublimation rate of the candidate source material 280 when entering the growth chamber 210 may be the same as or substantially the same as a sublimation rate of the target source material 240 (i.e., the sublimated target source material) in the growth chamber, thereby ensuring the growth of the crystal.

In some embodiments, the first region 260 may include a first upper cover 262 and a first lower cover 264. The first upper cover 262 and the first lower cover 264 may be made of graphite with a purity greater than 99.99% (e.g., prepared by sintering). In some embodiments, the surface of the graphite may be coated with an oxidation-resistant and high-temperature resistant material (e.g., tantalum carbide). In some embodiments, the first upper cover 262 and the first lower cover 264 may be surrounded with a first heating element 266 configured to preheat the candidate source material 280 placed in the first region 260. In some embodiments, the first heating element 266 may be a graphite resistive heating element. In some embodiments, a temperature of the first region 260 may be lower than a temperature of the growth chamber 210, and a temperature difference between the first region 260 and the growth chamber 210 may be less than a first preset temperature threshold.

In some embodiments, the second region 270 may be configured to temporarily store the sublimated target source material 240 that has been replaced. In some embodiments, the second region 270 may include a second upper cover 272 and a second lower cover 274. The second upper cover 272 and the second lower cover 274 may be made of graphite with a purity greater than 99.99% (e.g., prepared by sintering). In some embodiments, the surface of the graphite may be coated with an oxidation-resistant and high-temperature resistant material (e.g., tantalum carbide). In some embodiments, the second upper cover 272 and the second lower cover 274 may be surrounded with a second heating element 276 configured to maintain a stable temperature of the growth chamber 210 to ensure the crystal growth and the crystal quality. In some embodiments, the second heating element 276 may include a graphite resistance heating element. In some embodiments, a temperature of the second region 270 may be lower than the temperature of the growth chamber 210, and a temperature difference between the second region 270 and the growth chamber 210 may be less than a second preset temperature threshold.

In some embodiments, the control component may include a sensor (not shown), a controller (not shown), and a pushing member 290. The sensor may be configured to detect relevant parameters in the crystal growth process, for example, a crystal growth time length, a crystal growth rate, a sublimation rate of the target source material, etc. For example, the sensor may detect a time length, an increased weight of the crystal during the time length, etc., and determine a growth rate of the crystal according to the formula (1) based on a manual input or pre-stored crystal density, an inside area of the top cover, the detected time length, and the increased weight of the crystal during the time length. In some embodiments, the sensor may include a timer, a temperature sensor, a weight sensor, etc. The controller may be configured to determine whether a preset condition is satisfied based on the relevant parameters in the crystal growth process. For example, the controller may determine whether the crystal growth time period reaches a preset time period, determine whether the crystal growth rate reaches a first preset growth rate, determine whether the sublimation rate of the target source material reaches a preset sublimation rate, etc. When the preset condition is satisfied, the controller may control the pushing member 290 to push the candidate source material 280, such that the candidate source material 280 may push the sublimated target source material 240. Accordingly, the candidate source material 280 may leave the first region 260 and enter the growth chamber 210, and the sublimated target source material 240 may leave the growth chamber 210 and enter the second region 270, achieving that the sublimated target source material 240 may be replaced with the candidate source material 280. In some embodiments, the controller may include a microprocessor, a central processing unit (CPU), a physical operation processing unit (PPU), a microcontroller unit (MCU), a reduced instruction set computer (RISC), etc. In some embodiments, the pushing member 290 may include a pushing rod, a mechanical arm, etc.

In some embodiments, as described in operation 140, the speed that the control component controls the candidate source material 280 to push the sublimated target source material 240 may be less than a preset speed threshold. In some embodiments, the preset speed threshold may be a default setting of the system. Alternatively, the preset speed threshold may be adjusted according to different situations. For example, the preset speed threshold may be determined according to the weight of the target source material 240, the weight of the sublimated target source material 240, the weight of the candidate source material 280, the type of the crystal, etc. More descriptions regarding the speed that the control component controls the candidate source material 280 to push the sublimated target source material 240 may be found elsewhere in the present disclosure, for example, FIG. 1 and the descriptions thereof.

In some embodiments, the controller may be further configured to determine whether the preset condition is satisfied based on relevant parameters in the crystal growth process. For example, the controller may determine whether a distance between a portion where a length of the crystal increases and the target source material 240 and/or the candidate source material 280 reaches a preset distance, whether the growth rate of the crystal reaches a second preset growth rate, etc. In response to determining that the preset condition is satisfied, the controller may control a pulling member (not shown) (e.g., a pulling rod, a mechanical arm) to pull the crystal at a specific rate. In some embodiments, in order to grow the large-size and uniform crystal, the specific rate may be equal to the growth rate of the crystal, and a pulling direction may be opposite to a direction of the crystal growth in the axial direction. More descriptions regarding the growth rate of the crystal and the second preset growth rate may be found elsewhere in the present disclosure, for example, FIG. 1 and the descriptions thereof.

It should be noted that the above description is merely provided for example and illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the sensor may send the detected time length, the increased weight of the crystal during the time length, etc. to the controller, and the controller may determine the growth rate of the crystal.

Embodiment 1

The powder source materials include silicon carbide powders with a purity greater than 99.999% and a particle size of 48 micrometers, and silicon powders with a purity of 99.999% and a particle size of 41 micrometers, wherein a mass ratio of the silicon powders to the silicon carbide powders is 10%. The powder source materials were stirred for 8 hours using a mixer to mix the silicon carbide powders and silicon powders uniformly. Then, the uniformly mixed powder source materials were placed into a mold and made flat in the mold. An upper cover of the mold was covered and a steel plate with the same size as the mold was placed on the upper cover of the mold. The powder source materials were pressed using 20 Mpa pressure. The upper cover of the mold was then taken out and the mold including the powder source materials was placed into a vacuum high-temperature furnace for sintering. A sintering atmosphere was an argon atmosphere, a sintering pressure was $7\times10^4$ Pa, and a sintering temperature was 1850° C. After sintering for 20 hours, the mold was cooled to room temperature. A porous silicon carbide ceramic plate was prepared by demolding. A surface of the porous silicon carbide ceramic plate was polished to make the surface smooth. The surface of the porous silicon carbide ceramic plate was purged by nitrogen gas with a pressure of 0.02 Mpa and a purity greater than 99.99%. A thickness of the prepared piece of porous silicon carbide ceramic was 33 millimeters.

A seed crystal of 6H—SiC with a diameter of 150 millimeters was prepared according to PVT. The seed crystal was physically connected and fixed on a top cover of a growth chamber (e.g., a graphite crucible cover of the growth chamber 210). For example, firstly, an adhesive (e.g., sucrose) was placed flat on an inner side of the graphite crucible cover. Then the graphite crucible cover was placed in a muffle furnace, heated to 150° C. and maintained for 5 hours, and then heated to 200° C. and maintained for 7 hours. Next, the seed crystal of 6H—SiC was placed on the inside of the graphite crucible cover flatted with the sucrose to be concentric with the graphite crucible cover. Then a clean piece of single crystal wafer of silicon carbide with a same size as the seed crystal of 6H—SiC was placed on the 6H—SiC seed crystal and a stainless steel block with a diameter of 150 millimeters and a thickness of 20 millimeters was pressed on the single crystal wafer of silicon carbide. Next, the graphite crucible cover, the seed crystal of 6H—SiC, the piece of single crystal wafer of silicon carbide, and the stainless steel block were placed as a whole into the muffle furnace, heated to 380° C., maintained for 5 hours, and taken out until the whole was slowly cooled to room temperature.

A piece of porous silicon carbide ceramic was placed in the growth chamber. A direction of a growth surface of the seed crystal of 6H—SiC was [0001] deflected by 4° to [11$\bar{2}$0] direction. A vertical distance between the seed crystal and the piece of porous silicon carbide ceramic was adjusted to 30 millimeters.

The growth chamber was heated to 2320° C. and the graphite crucible cover was heated to 2245° C. Two pieces of silicon carbide porous ceramics (the candidate source materials) were placed in a first region and heated to 1700° C.; a second region was heated to 1700° C. A growth atmosphere was argon, and pressures of the growth chamber, the first region, and the second region were maintained at 15 Torr during the crystal growth process. A piece of porous silicon carbide ceramic was replaced after sublimation and decomposition for 20 hours. Before replacement, the first region was heated to the same temperature as the growth chamber (i.e., 2320° C.) and maintained for 1 hour. When replacing, a pushing component was controlled to slowly push a piece of porous silicon carbide ceramic (the candidate source material) in the first region into the growth chamber at a speed of 100 millimeters/hour. After the piece of porous silicon carbide ceramic used for replacement was completely pushed into the growth chamber, the piece of porous silicon carbide ceramic was sublimated and decomposed for 20 hours, and then replaced again. The replaced piece of sublimated porous silicon carbide ceramic was pushed into the second region for temporary storage.

After the pieces of sublimated ceramic of silicon carbide were replaced twice, the crystal ingot of 6H—SiC had a growth surface diameter of 158 millimeters and a growth length reaching 53 millimeters.

Embodiment 2

The powder source materials include silicon carbide powders with a purity greater than 99.999% and a particle size of 48 micrometers, and silicon powders with a purity of 99.999% and a particle size of 41 micrometers, wherein a mass ratio of the silicon powders to the silicon carbide powders is 10%. The powder source materials were stirred for 8 hours using a mixer to mix the silicon carbide powders and the silicon powders uniformly. Then, the uniformly mixed powder source materials were placed into a mold and made flat in the mold. An upper cover of the mold was covered and a steel plate with the same size as the mold was placed on the upper cover of the mold. The powder source materials were pressed using 15 Mpa pressure. The upper cover of the mold was then taken out and the mold including the powder source materials was placed into a vacuum high-temperature furnace for sintering. A sintering atmosphere was an argon atmosphere, a sintering pressure was $7\times10^4$ Pa, and a sintering temperature was 1800° C. After sintering for 20 hours, the mold was cooled to room temperature. A porous silicon carbide ceramic plate was prepared by demolding. A surface of the porous silicon carbide ceramic plate was polished to make the surface smooth. The surface of the porous silicon carbide ceramic plate was purged with nitrogen gas with a pressure of 0.02 Mpa and a purity greater than 99.99%. A thickness of the prepared piece of porous silicon carbide ceramic was 35 millimeters.

A seed crystal of 6H—SiC with a diameter of 150 millimeters was prepared according to PVT. The seed crystal was physically connected and fixed on a top cover of a growth chamber (e.g., a graphite crucible cover of the growth chamber 210). For example, firstly, an adhesive (e.g., sucrose) was placed flat on an inner side of the graphite crucible cover. Then the graphite crucible cover was placed in a muffle furnace, heated to 150° C. and maintained for 5 hours, and then heated to 200° C. and maintained for 7 hours. Next, the seed crystal of 6H—SiC was placed on the inside of the graphite crucible cover flatted with the sucrose to be concentric with the graphite crucible cover. Then a clean piece of single crystal wafer of silicon carbide with a same size as the seed crystal of 6H—SiC was placed on the 6H—SiC seed crystal and a stainless steel block with a diameter of 150 millimeters and a thickness of 20 millimeters was pressed on the single crystal wafer of silicon carbide. Next, the graphite crucible cover, the seed crystal of 6H—SiC, the piece of single crystal wafer of silicon carbide, and the stainless steel block were placed as a whole into the muffle furnace, heated to 380° C., maintained for 5 hours, and was taken out until the whole was slowly cooled to room temperature.

A piece of porous silicon carbide ceramic was placed in the growth chamber. A direction of a growth surface of the seed crystal of 6H—SiC was [0001] deflected by 4° to [11$\bar{2}$0] direction. A vertical distance between the seed crystal and the piece of porous silicon carbide ceramic was adjusted to 30 millimeters.

The growth chamber was heated to 2300° C. and the graphite crucible cover was heated to 2218° C. Four pieces of porous silicon carbide ceramics (the candidate source materials) were placed in a first region and heated to 1700° C.; a second region was heated to 1700° C. A growth atmosphere was argon, and pressures of the growth chamber, the first region, and the second region were maintained at 15

Torr during the crystal growth process. A piece of porous silicon carbide ceramic was replaced after sublimation and decomposition for 20 hours. Before replacement, the first region was heated to the same temperature as the growth chamber (i.e., 2300° C.) and maintained for 1 hour. When replacing, a pushing component was controlled to slowly push a piece of porous silicon carbide ceramic (the candidate source material) in the first region into the growth chamber at a speed of 130 millimeters/hour. After the piece of porous silicon carbide ceramic used for replacement was completely pushed into the growth chamber, the piece of porous silicon carbide ceramic was sublimated and decomposed for 20 hours, and then replaced again. The replaced piece of sublimated porous silicon carbide ceramic was pushed into the second region for temporary storage.

After the pieces of sublimated ceramic of silicon carbide were replaced four times, the crystal ingot of 6H—SiC had a growth surface diameter of 163 millimeters and a growth length reaching 77 millimeters.

Embodiment 3

The powder source materials include silicon carbide powders with a purity greater than 99.999% and a particle size of 48 micrometers, and silicon powders with a purity of 99.999% and a particle size of 41 micrometers, wherein a mass ratio of the silicon powders to the silicon carbide powders is 5%. The powder source materials were stirred for 8 hours using a mixer to mix the silicon carbide powders and the silicon powders uniformly. Then, the uniformly mixed powder source materials were placed into a mold, and made flat in the mold. An upper cover of the mold was covered and a steel plate with the same size as the mold was placed on the mold upper cover. The powder source materials were pressed using 20 Mpa pressure. The upper cover plate of the mold was then taken out, and the mold including the powder source materials was placed into a vacuum high-temperature furnace for sintering. A sintering atmosphere was an argon atmosphere, a sintering pressure was $7\times10^4$ Pa, and a sintering temperature was 1850° C. After sintering for 20 hours, the mold was cooled to room temperature. A porous silicon carbide ceramic plate was obtained by demolding. A surface of the porous silicon carbide ceramic plate was polished to make the surface smooth. The surface of the porous silicon carbide ceramic plate was purged with nitrogen gas with a pressure of 0.02 Mpa and a purity greater than 99.99%. A thickness of the prepared piece of porous silicon carbide ceramic was 35 millimeters.

A seed crystal of 4H—SiC with a diameter of 150 millimeters was prepared according to PVT. The seed crystal of 4H—SiC was physically connected and fixed on a top cover of a growth chamber (e.g., a graphite crucible cover of the growth chamber 210). For example, firstly, an adhesive (e.g., sucrose) was placed flat on an inner side of the graphite crucible cover. Then the graphite crucible cover was placed in a muffle furnace, heated to 150° C. and maintained for 5 hours, and then heated to 200° C. and maintained for 7 hours. Next the seed crystal of 4H—SiC was placed on the inside of the graphite crucible cover flatted with the sucrose to be concentric with the graphite crucible cover. Then a clean piece of single crystal wafer of silicon carbide with a same size with the seed crystal of 4H—SiC was placed on the seed crystal of 4H—SiC and a stainless steel block with a diameter of 150 millimeters and a thickness of 20 millimeters was pressed on the single crystal wafer of silicon carbide. Next, the graphite crucible cover, the seed crystal of 6H—SiC, the piece of single crystal wafer of silicon carbide, and the stainless steel block were placed as a whole into the muffle furnace, heated to 380° C., maintained for 5 hours, and taken out until the whole was slowly cooled to room temperature.

A piece of porous silicon carbide ceramic was placed in the growth chamber. A direction of a growth surface of the seed crystal of 4H—SiC was $[000\bar{1}]$ deflected by 4° to $[11\bar{2}0]$ direction. A vertical distance between the seed crystal and the piece of porous silicon carbide ceramic was adjusted to 30 millimeters.

The growth chamber was heated to 2200° C., and the graphite crucible cover was heated to 2117° C. Two pieces of porous silicon carbide ceramics (the candidate source materials) were placed in a first region and heated to 1700° C.; a second region was heated to 1700° C. A growth atmosphere was argon, and pressures of the growth chamber, the first region, and the second region during the process of crystal growth were maintained at 15 Torr. A piece of porous silicon carbide ceramic was replaced after sublimation and decomposition for 20 hours. Before replacement, the first region was heated to the same temperature as the growth chamber (i.e., 2200° C.) and maintained for 1 hour. When replacing, the pushing component was controlled to slowly push a piece of porous silicon carbide ceramic (the candidate source material) in the first region into the growth chamber at a speed of 100 millimeters/hour. After the piece of porous silicon carbide ceramic used for replacement was completely pushed into the growth chamber, the piece of porous silicon carbide ceramic was sublimated and decomposed for 20 hours, and then replaced again. The replaced piece of sublimated porous silicon carbide ceramic was pushed into the second region for temporary storage.

After the pieces of sublimated ceramic of silicon carbide were replaced twice, the crystal ingot of 4H—SiC had a growth surface diameter of 155 millimeters and a growth length reaching 51 millimeters.

Embodiment 4

The powder source materials include silicon carbide powders with a purity greater than 99.999% and a particle size of 48 micrometers, and silicon powders with a purity of 99.999% and a particle size of 41 micrometers, wherein a mass ratio of the silicon powders to the silicon carbide powders is 5%. The powder source materials were stirred for 8 hours using a mixer to mix the silicon carbide powders and the silicon powders uniformly. Then, the uniformly mixed powder source materials were placed into a mold, and made flat in the mold. An upper cover of the mold was covered and a steel plate with the same size as the mold was placed on the upper cover of the mold. The powder source materials were pressed using 20 Mpa pressure. The upper cover of the mold was then taken out and the mold including the powder source material was placed into a vacuum high-temperature furnace for sintering. A sintering atmosphere was an argon atmosphere, a sintering pressure was $7\times10^4$ Pa, and a sintering temperature was 1850° C. After sintering for 20 hours, the mold was cooled to room temperature. A porous silicon carbide ceramic plate was prepared by demolding. A surface of the porous silicon carbide ceramic plate was polished to make the surface smooth. The surface of the porous silicon carbide ceramic plate was purged with nitrogen gas with a pressure of 0.02 Mpa and a purity greater than 99.99%. A thickness of the prepared piece of porous silicon carbide ceramic was 34 millimeters.

A seed crystal of 3C—SiC with a diameter of 40 millimeters was prepared according to chemical vapor deposition (CVD). The seed crystal of 3H—SiC was physically connected and fixed on a top cover of the growth chamber (e.g., a graphite crucible cover of the growth chamber 210). For example, firstly, an adhesive (e.g., sucrose) was placed flat on an inner side of the graphite crucible cover. Then the graphite crucible cover was placed in a muffle furnace, heated to 150° C. and maintained for 5 hours, and then heated to 200° C. and maintained for 7 hours. Next, the seed crystal of 3C—SiC was placed on the inside of the graphite crucible cover flatted with the sucrose to be concentric with the graphite crucible cover. Then a clean piece of single crystal wafer of silicon carbide with a same size of the seed crystal of 3C—SiC was placed on the 3C—SiC seed crystal and a stainless steel block with a diameter of 40 millimeters and a thickness of 20 millimeters was pressed on the single crystal wafer of silicon carbide. Next, the graphite crucible cover, the seed crystal of 6H—SiC, the piece of single crystal wafer of silicon carbide, and the stainless steel block were placed as a whole into the muffle furnace, heated to 380° C., maintained for 5 hours, and taken out until the whole was slowly cooled to room temperature.

A piece of porous silicon carbide ceramic was placed in the growth chamber. A direction of a growth surface of the seed crystal of 3C—SiC was [001]. A vertical distance between the seed crystal and the piece of porous silicon carbide ceramic was adjusted to 30 millimeters.

A temperature of the growth chamber was heated to 1850° C. and a temperature of the graphite crucible cover was heated to 1765° C. Two pieces of porous silicon carbide ceramics (the candidate source materials) were placed in a first region and heated to 1700° C.; a second region was heated to 1700° C. A growth atmosphere was argon, and pressures of the growth chamber, the first region, and the second region were maintained at 10 Torr during the crystal growth process. A piece of porous silicon carbide ceramic was replaced after sublimation and decomposition for 20 hours. Before replacement, the first region was heated to the same temperature as the growth chamber (i.e., 1850° C.) and maintained for 1 hour. When replacing, a pushing component was controlled to slowly push a piece of porous silicon carbide ceramic (the candidate source material) in the first region into the growth chamber at a speed of 100 millimeters/hour. After the piece of porous silicon carbide ceramic used for replacement was completely pushed into the growth chamber, the piece of porous silicon carbide ceramic was sublimated and decomposed for 20 hours, and then replaced again. The replaced piece of sublimated porous silicon carbide ceramic was pushed into the second region for temporary storage.

After the pieces of sublimated ceramic of silicon carbide were replaced twice, the crystal ingot of 3C—SiC had a growth surface diameter of 40.3 millimeters and a growth length reaching 87 millimeters.

The possible beneficial effects of the embodiments of the present disclosure may include, but not be limited to the following. (1) According to some embodiments of the present disclosure, a crystal with large size and high quality can be prepared according to PVT by replacing a sublimated target source material with a candidate source material. (2) According to some embodiments of the present disclosure, a block material is used as a source material, which has a high material utilization rate and is easy to transfer and replace, not causing dust during the growth process which may result in pollution to the crystal growth. (3) According to some embodiments of the present disclosure, for growing a silicon carbide crystal, the target source material and/or the candidate source material may be prepared using silicon carbide powders and silicon powders that are mixed in a preset ratio. In such cases, the adhesion of silicon carbide powders can be enhanced and the utilization rate of the target source material and/or the candidate source material can be improved, avoiding a decrease of the sublimation rate of silicon carbide caused by a solid component C produced by the sublimation and decomposition of silicon carbide.

It should be noted that different embodiments may have different beneficial effects. In different embodiments, possible beneficial effects may be any of the above effects, or any combination thereof, or any other beneficial effects that may be obtained.

The basic concepts have been described above. Obviously, for those skilled in the art, the detailed disclosure is merely by way of example, and does not constitute a limitation on the present disclosure. Although not explicitly stated here, those skilled in the art may make various modifications, improvements, and amendments to the present disclosure. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment," "one embodiment," or "an alternative embodiment" in various portions of this specification are not necessarily all referring to the same embodiment. In addition, certain features, structures, or characteristics in one or more embodiments of the present disclosure may be appropriately combined.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installing on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure method does not mean that the present disclosure object requires more features than the features mentioned in the claims. Rather, claimed subject matter may lie in less than all features of a single foregoing disclosed embodiment.

In some embodiments, numbers expressing quantities of ingredients, properties, and so forth, used to describe and claim certain embodiments of the application are to be understood as being modified in some instances by the term "about," "approximate," or "substantially". Unless otherwise stated, "about," "approximate," or "substantially" may indicate ±20% variation of the value it describes. Accordingly, in some embodiments, the numerical parameters set forth in the description and attached claims are approximations that may vary depending upon the desired properties sought to be obtained by a particular embodiment. In some embodiments, the numerical parameters should be construed in light of a count of reported significant digits and by applying ordinary rounding techniques. Notwithstanding that the numerical ranges and parameters configured to illustrate the broad scope of some embodiments of the present disclosure are approximations, the numerical values in specific examples may be as accurate as possible within a practical scope.

Each patent, patent application, patent application publication and other materials cited herein, such as articles, books, instructions, publications, documents, etc., are hereby incorporated by reference in their entirety. In addition to the application history documents that are inconsistent or conflicting with the contents of the present disclosure, the documents that may limit the widest range of the claim of the present disclosure (currently or later attached to this application) are excluded from the present disclosure. It should be noted that if the description, definition, and/or terms used in the appended application of the present disclosure is inconsistent or conflicting with the content described in the present disclosure, the use of the description, definition and/or terms of the present disclosure shall prevail.

At last, it should be understood that the embodiments described in the present disclosure are merely illustrative of the principles of the embodiments of the present disclosure. Other modifications may be within the scope of the present disclosure. Accordingly, by way of example, and not limitation, alternative configurations of embodiments of the present disclosure may be considered to be consistent with the teachings of the present disclosure. Accordingly, embodiments of the present disclosure are not limited to the embodiments that are expressly introduced and described herein.

What is claimed is:

1. A method for crystal growth, comprising:

placing a seed crystal and a target source material in a growth chamber of an apparatus for crystal growth;

executing a growth of a crystal based on the seed crystal and the target source material according to physical vapor transport;

determining whether a preset condition is satisfied during the growth of the crystal; and in response to determining that the preset condition is satisfied, replacing a sublimated target source material with a candidate source material, wherein the replacing the sublimated target source material with the candidate source material includes:

controlling the candidate source material to enter the growth chamber to push the sublimated target source material such that the sublimated target source material leaves the growth chamber.

2. The method of claim 1, wherein the target source material or the candidate source material includes a block material.

3. The method of claim 2, wherein a shape of the block material includes a cube, a cuboid, or an irregular block.

4. The method of claim 2, wherein a thickness of the block material is less than a preset thickness threshold.

5. The method of claim 2, wherein a thickness of the block material is 30 millimeters~40 millimeters.

6. The method of claim 1, wherein the target source material and/or the candidate source material are prepared through a processing process, the processing process including:

preparing the target source material and/or the candidate source material by performing at least one of a pressing operation, a sintering operation, a polishing operation, or a purging operation on powder source materials.

7. The method of claim 6, wherein a processing condition of the sintering includes an inert atmosphere condition.

8. The method of claim 1, wherein the candidate source material is controlled to enter the growth chamber from a first region.

9. The method of claim 8, wherein a temperature of the first region is lower than a temperature of the growth chamber, and a temperature difference between the first region and the growth chamber is less than a first preset temperature threshold.

10. The method of claim 9, wherein the first preset temperature threshold is determined according to a distance between the first region and the growth chamber.

11. The method of claim 8, further including:

performing a preheating treatment on the candidate source material in the first region, the preheating treatment including heating the candidate source material to a sublimation temperature of the crystal and keeping the sublimation temperature for a preset time period.

12. The method of claim 11, wherein the preset time period is determined according to a size of the candidate source material.

13. The method of claim 1, wherein a speed of controlling the candidate source material to push the sublimated target source material is less than a preset speed threshold.

14. The method of claim 1, wherein a speed of controlling the candidate source material to push the sublimated target source material is 100 millimeters/hour~ 150 millimeters/hour.

15. The method of claim 14, wherein the speed of controlling the candidate source material to push the sublimated target source material is determined according to a weight of the sublimated target source material.

16. The method of claim 1, wherein the sublimated target source material is pushed to leave the growth chamber and enter a second region of the apparatus for crystal growth.

17. The method of claim 16, wherein a temperature of the second region is lower than a temperature of the growth chamber, and a temperature difference between the second region and the growth chamber is less than a second preset temperature threshold.

18. The method of claim 17, wherein the second preset temperature threshold is determined according to a distance between the second region and the growth chamber.

19. The method of claim 1, wherein the crystal includes silicon carbide, aluminum nitride, zinc oxide, or zinc telluride.

20. The method of claim 1, wherein the preset condition includes a crystal growth time length reaching a preset time length.

* * * * *